(12) United States Patent
Miyamoto (10) Patent No.: US 10,985,672 B2
(45) Date of Patent: Apr. 20, 2021

(54) INVERTER DEVICE HAVING THREE PHASE SECTIONS

(71) Applicant: MEIDENSHA CORPORATION, Tokyo (JP)

(72) Inventor: Yasumasa Miyamoto, Numadu (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 16/635,683

(22) PCT Filed: May 8, 2018

(86) PCT No.: PCT/JP2018/017684
§ 371 (c)(1),
(2) Date: Mar. 4, 2020

(87) PCT Pub. No.: WO2019/026369
PCT Pub. Date: Feb. 7, 2019

(65) Prior Publication Data
US 2020/0382019 A1 Dec. 3, 2020

(30) Foreign Application Priority Data

Aug. 2, 2017 (JP) .............................. JP2017-149554
Feb. 9, 2018 (JP) .............................. JP2018-021716

(51) Int. Cl.
*H02M 7/483* (2007.01)
*G01R 19/00* (2006.01)
(Continued)

(52) U.S. Cl.
CPC ........ *H02M 7/483* (2013.01); *G01R 19/0092* (2013.01); *H05K 5/0247* (2013.01); *H02M 2001/0009* (2013.01)

(58) Field of Classification Search
CPC .......... H02M 7/003; H02M 2001/0009; G01R 19/0092; H05K 5/0247
See application file for complete search history.

(56) References Cited

U.S. PATENT DOCUMENTS 6,538,404 B2 * 3/2003 Kato ................. H02M 7/53871
318/139
8,976,526 B2 * 3/2015 Kulkarni .............. H05K 7/1432
361/700
(Continued)

FOREIGN PATENT DOCUMENTS

CN 201181906 Y 1/2009
CN 206302329 U 7/2017
(Continued)

OTHER PUBLICATIONS

Extended European Search Report issued in European Patent Application No. 18840447.9 dated Feb. 19, 2021, nine (9) pages.

*Primary Examiner* — Yusef A Ahmed
(74) *Attorney, Agent, or Firm* — Foley & Lardner LLP (57) ABSTRACT

An inverter device includes: three phase sections each including multiple single-phase output inverter cells connected in series, wherein each inverter cell receives input of alternating current power via a transformer; a neutral point to which an end of the series connection of each phase section is connected; current sensors each disposed at a line between the neutral point and a neutral-point-side inverter cell of the corresponding phase section; a transformer board containing the transformer; an inverter board containing the inverter cells, and being adjacent to the transformer board; and an output board containing a controller, wherein the output board includes a three-phase output terminal connected to a load, and is adjacent to the inverter board. Each line from the neutral-point-side inverter cell to the neutral point includes a part diverted from the inverter board into the (Continued)

output board, wherein each current sensor is arranged in the output board.

12 Claims, 5 Drawing Sheets

(51) Int. Cl.
 *H05K 5/02* (2006.01)
 *H02M 1/00* (2006.01)

(56) References Cited

U.S. PATENT DOCUMENTS

| | | | | |
|---|---|---|---|---|
| 9,220,179 | B2* | 12/2015 | Ledezma | H05K 7/14 |
| 2006/0274560 | A1* | 12/2006 | Rastogi | H02P 27/08 |
| | | | | 363/131 |
| 2010/0142234 | A1* | 6/2010 | Abolhassani | H02M 5/4585 |
| | | | | 363/41 |
| 2010/0328848 | A1* | 12/2010 | Ledezma | H02P 27/14 |
| | | | | 361/603 |
| 2010/0328883 | A1* | 12/2010 | Ledezma | H05K 7/1432 |
| | | | | 361/690 |
| 2011/0044010 | A1* | 2/2011 | Ledezma | H02M 7/003 |
| | | | | 361/727 |
| 2011/0215890 | A1* | 9/2011 | Abolhassani | H01F 27/025 |
| | | | | 336/60 |
| 2012/0033472 | A1* | 2/2012 | Oka | H02P 27/08 |
| | | | | 363/127 |
| 2012/0127673 | A1* | 5/2012 | Ledezma | H05K 7/1432 |
| | | | | 361/730 |
| 2012/0275202 | A1* | 11/2012 | Yamamoto | H02M 1/32 |
| | | | | 363/71 |
| 2012/0327602 | A1* | 12/2012 | Kulkarni | H02M 7/003 |
| | | | | 361/700 |
| 2013/0003299 | A1* | 1/2013 | Wissner | H02M 7/003 |
| | | | | 361/695 |
| 2014/0210431 | A1* | 7/2014 | Rastogi | H02M 7/49 |
| | | | | 323/234 |
| 2014/0307497 | A1* | 10/2014 | Yoo | H02M 7/49 |
| | | | | 363/131 |
| 2015/0003015 | A1* | 1/2015 | Kulkarni | H05K 7/202 |
| | | | | 361/700 |
| 2015/0022135 | A1* | 1/2015 | Yun | H02M 7/49 |
| | | | | 318/500 |
| 2016/0105986 | A1* | 4/2016 | Ledezma | H05K 7/14 |
| | | | | 361/730 |
| 2017/0019029 | A1* | 1/2017 | Gekinozu | H02M 3/33507 |
| 2017/0288562 | A1* | 10/2017 | Palle | H02M 7/49 |
| 2018/0131193 | A1* | 5/2018 | Zhao | H02J 13/00017 |
| 2018/0241317 | A1* | 8/2018 | Abdalla | H05K 1/0262 |
| 2019/0098777 | A1* | 3/2019 | Nakatsu | H05K 7/20927 |

FOREIGN PATENT DOCUMENTS

| | | |
|---|---|---|
| EP | 0 707 367 A1 | 4/1996 |
| JP | 2001-238455 A | 8/2001 |
| JP | 2004-357436 A | 12/2004 |
| JP | 2007-129861 A | 5/2007 |
| JP | 4609102 B2 | 1/2011 |
| JP | 6027060 B2 | 11/2016 |

\* cited by examiner

INVERTER DEVICE HAVING THREE PHASE SECTIONS

BACKGROUND

The present disclosure relates to an inverter device in which a U-phase section, a V-phase section, and a W-phase section are each composed of multiple single-phase output inverter cells connected in series, namely, a series multiplex inverter device, and particularly to improvement in arrangement of current sensors for sensing phase currents.

A patent document 1 and a patent document 2 each disclose a series multiplex inverter device in which a U-phase section, a V-phase section, and a W-phase section are each composed of multiple three-phase-input single-phase-output inverter cells connected in series. Each of the inverter cells includes a rectifier section for rectifying three-phase AC power inputted via an input transformer, and an inverter section for performing reverse conversion from DC to a single-phase AC output. The U-phase section, V-phase section, and W-phase section are each composed of multiple output terminals of the inverter cells connected in series. Accordingly, an output line finally connected to a load is at a potential equal to a sum of output voltages of the inverter cells.

For example, this type of inverter device is configured to directly receive a high voltage of 3.3 kV to 6.6 kV, and output a high voltage of 3.3 kV to 6.6 kV by the multiple single-phase output inverter cells connected in series, and is used for driving control of a high-voltage three-phase AC motor.

In such an inverter device, a current sensor may be provided for sensing a current of each phase in order to control an inverter output current or perform a protection operation when the current flows excessively. According to patent document 1, a current sensor is arranged at an output line of each phase section that is connected to the load.

Patent document 2 discloses a configuration in which two cell output lines are each provided with a current sensor inside a single-phase output inverter cell constituting each phase section.

In a configuration in which current sensors are arranged at output lines of a series multiplex inverter device as in patent document 1, it is generally required to ensure a large clearance for inter-phase insulation among three-phase output lines, so that it is easy to ensure a space where the current sensors are inserted. In addition, the output lines of the series multiplex inverter device are often arranged near a controller to which current sensing signals are inputted, so that the arrangement of the current sensors at the output lines tends to shorten signal lines between the controller and the current sensors. This serves to suppress superimposition of noise on the signal lines.

However, in circuit configuration of such a series multiplex inverter device with a higher voltage, each of the potential differences among the phase sections at the output lines connected to the load is very high. In addition, these output lines are often bundled close to a metal sheet of a board cabinet at a ground potential. Therefore, each output line of the inverter device is required to be a high-voltage electric wire having a thick insulating coating and having a large diameter enough to withstand the potential differences among the lines and the potential difference from the ground potential. In many cases, the current sensors are each generally implemented by a through-type current sensor. In order to measure a current flowing through such a large diameter high withstand voltage electric wire, the current sensors are each implemented by one having a large through hole diameter and high voltage specifications.

In view of the foregoing, in the configuration in which the current sensors are arranged at the output lines of the series multiplex inverter device as in patent document 1, there is a problem that the current sensors are increased in cost and size.

Furthermore, in the configuration of patent document 1, it is required to ensure a space in which a plurality of such large-sized current sensors can be installed in the board cabinet of the series multiplex inverter device. This causes an increase in size of the entire series multiplex inverter.

As described above, arrangement of a current sensor and a controller close to each other serves to shorten the signal line therebetween. However, in the configuration of patent document 1, each output line of the inverter device is at a higher potential than the ground potential. If the output line of the inverter device is close to the controller, the controller is susceptible to spatial noise occurring from the output line at the high potential, and may therefore malfunction.

On the other hand, in the configuration of patent document 2, the cell output line of the single-phase output inverter cell has a relatively low voltage, so that the current sensor provided at the cell output line does not need to have high withstand voltage specifications. However, there is a problem in this configuration that since arrangement of the current sensor inside the inverter cell causes an increase in size of the inverter cell, and an increase in size of the entire inverter device composed of the inverter cells. Furthermore, if the current of each of the U, V, W phases is sensed by the current sensor of one of the inverter cells of each phase, there are both of the inverter cell provided with the current sensor and inverter cells provided with no current sensor. This causes complicated management during manufacturing the series multiplex inverter device. If every inverter cell is provided with the current sensor, the inverter cells are identical in configuration to each other and can be easily managed, but the cost increases accordingly.

PRIOR ART DOCUMENT(S)

Patent Document(s)

Patent Document 1: Japanese Patent No. 4609102
Patent Document 2: Japanese Patent No. 6027060

SUMMARY

According to the present disclosure, an inverter device includes: phase sections including a U-phase section, a V-phase section, and a W-phase section, each of which includes multiple single-phase output inverter cells connected in series, and wherein each of the single-phase output inverter cells is configured to receive input of alternating current power via a transformer; a neutral point to which an end of the series connection of each of the phase sections is connected; and at least two current sensors, each of which is disposed at a line between the neutral point and a neutral-point-side one of the single-phase output inverter cells of a corresponding one of the phase sections closest to the neutral point.

In the series multiplex inverter device in which each of the U-phase section, V-phase section, and W-phase section includes multiple single-phase output inverter cells connected in series, a current flowing through an output line of each phase of the inverter device connected to a load is identical to a current flowing through the line of each phase between the neutral point and the neutral-point-side single-phase output inverter cell. In view of this, according to the present disclosure, the current sensor is not arranged at the output line but arranged at the neutral-point-side line for current sensing. Accordingly, the neutral-point-side line where the current sensor is arranged according to the present disclosure is at a low potential close to the ground potential, and there is no potential difference among the phases. This allows to use lines having low withstand voltage specifications, and implement the current sensing by relatively small current sensors.

Even when the controller is arranged near the current sensors, there is no possibility of malfunction of the controller due to spatial noise, because the potential of the neutral-point-side line is low. In other words, it is possible to arrange the controller apart from the output lines of the inverter device, and suppress the influence of spatial noise from the output lines.

Since the sum of the currents flowing through the U-phase, V-phase, and W-phase sections is equal to 0, it is sufficient to sense at least two phase currents by the current sensors, while calculating the remaining phase current.

In a preferred embodiment of the present disclosure, the neutral point is grounded. For example, the neutral point is grounded via an impedance component such as a resistance, a reactor, or a capacitor. In this configuration in which the neutral point is grounded, the potential of each neutral-point-side line where the current sensor is arranged is equal to the ground potential. This allows these lines and the corresponding current sensors to have low withstand voltage specifications.

For example, each current sensor is implemented by a through-type current sensor. A through-type current sensor having a small through hole and low withstand voltage specifications is small and inexpensive.

In a preferred aspect of the present disclosure, the inverter device has an overall board configuration including: a transformer board including a cabinet containing the transformer; an inverter board including a cabinet containing the single-phase output inverter cells, wherein the inverter board is disposed adjacent to the transformer board; and an output board including a cabinet containing a controller, wherein the output board includes a three-phase output terminal structured to be connected to a load, and is disposed adjacent to the inverter board, wherein the controller is configured to control the single-phase output inverter cells; wherein each of the lines from the neutral-point-side single-phase output inverter cell to the neutral point includes a part diverted from the inverter board into the cabinet of the output board; and wherein each of the current sensors disposed at the corresponding lines is arranged in the cabinet of the output board.

In this configuration, the current sensors and the controller are accommodated in the same board cabinet, thereby reducing the length of the signal line therebetween. In addition, the controller is less susceptible to heat generated by the inverter cells.

When the neutral point is grounded via an impedance component, it is desirable that the impedance component is implemented by a component such as a resistance which is contained in the cabinet of the output board. This serves to shorten the length of the line between the current sensor and the component such as a resistance.

Preferably, each of the transformer board and the output board includes a ground terminal, and the neutral point is connected to the ground terminal of the output board directly or via an impedance component. This serves to shorten the length of the line from the neutral point to the ground terminal, because the line does not pass through the inverter board.

In another preferred embodiment of the present disclosure, the inverter device has an overall board configuration including: a transformer board including a cabinet containing the transformer; a current sensor board including a cabinet that contains a controller and each of the current sensors, wherein the current sensor board is disposed adjacent to the transformer board, and wherein the controller is configured to control the single-phase output inverter cells; and an inverter board including a cabinet containing the single-phase output inverter cells, wherein the inverter board is disposed adjacent to the current sensor board.

Also in this configuration, the current sensors and the controller are accommodated in the same board cabinet, thereby reducing the length of the signal line therebetween. In addition, the controller is less susceptible to heat generated by the inverter cells.

When the neutral point is grounded via an impedance component, it is desirable that the impedance component is implemented by a component such as a resistance which is contained in the cabinet of the current sensor board. This serves to shorten the length of the line between the current sensor and the component such as a resistance.

Preferably, each of the transformer board and the electric sensor board includes a ground terminal, and the neutral point is connected to the ground terminal of the electric sensor board directly or via an impedance component. This serves to shorten the length of the line from the neutral point to the ground terminal, because the line does not pass through the cabinet of the current sensor board or the transformer board.

According to the present disclosure, each current sensor is arranged at the line between the neutral point and the neutral-point-side single-phase output inverter cell that is at the lowest potential in the circuit configuration of the series multiplex inverter device. This allows the current sensor to be implemented by a small and inexpensive current sensor with low withstand voltage specifications, and thereby allows the size and cost of the series multiple inverter device to be reduced.

DETAILED DESCRIPTION

The following describes an embodiment of the present disclosure in detail with reference to the drawings.

Figure 1:
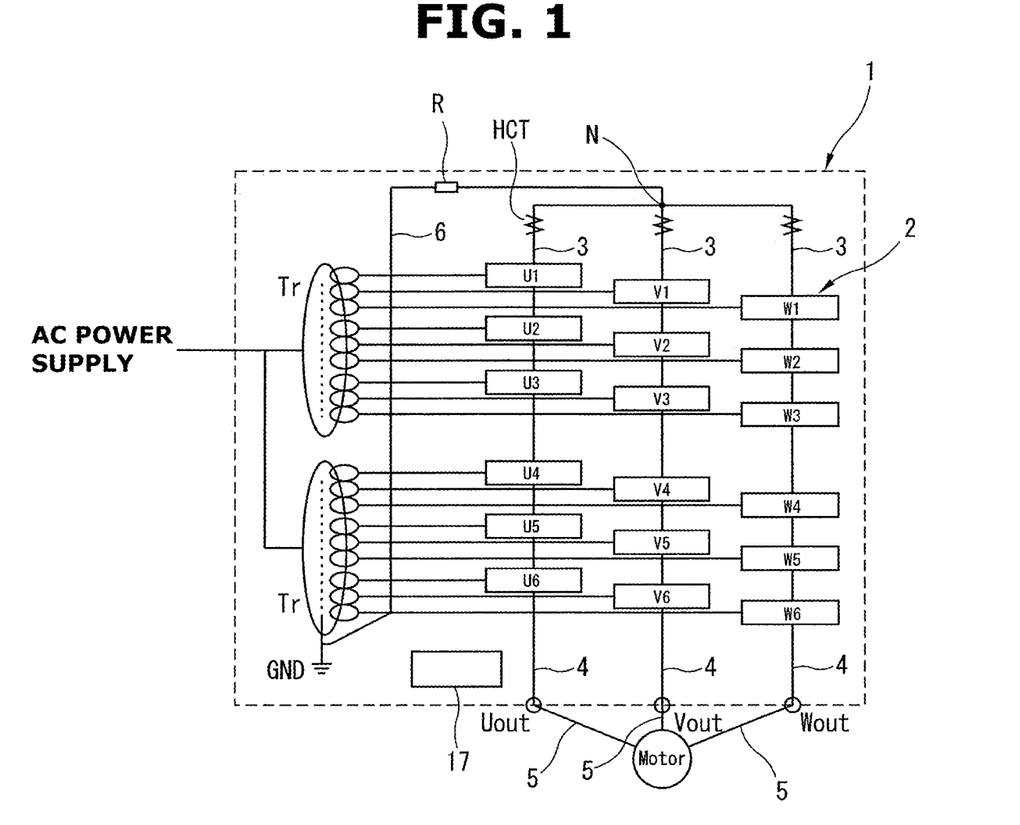
FIG. 1 is a circuit diagram of a series multiplex inverter device according to an embodiment.
Figure 2:
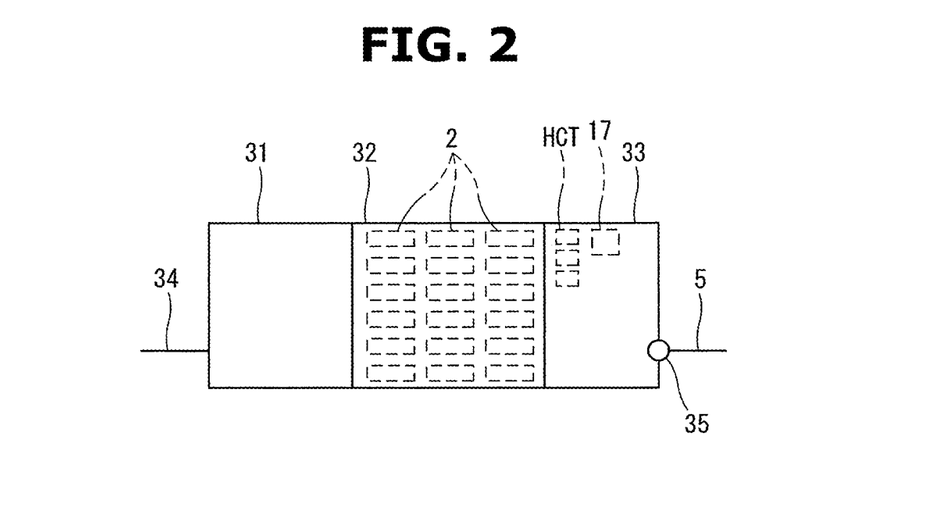
FIG. 2 is an explanatory diagram showing a first embodiment of board configuration of the inverter device.

FIG. 1 shows circuit configuration of a series multiplex inverter device 1 according to the embodiment. FIG. 2 specifically shows board configuration of the inverter device 1. In FIG. 1, U1 to U6, V1 to V6, and W1 to W6 represent three-phase-input single-phase-output inverter cells 2, respectively. These multiple single-phase output inverter cells 2 are connected in series to form a U-phase section, a V-phase section, and a W-phase section. For example, the U-phase section is composed of six inverter cells 2 (U1 to U6) connected in series, and the V-phase and W-phase sections are each similarly composed of six inverter cells 2 (V1 to V6, W1 to W6) connected in series. The series connection of each of these phase sections has a first end connected via a line 3 to each other at a neutral point N, and a second end connected via an output line 4 to an output terminal Uout, Vout, Wout. These output terminals Uout, Vout, and Wout are connected via a high-voltage line 5 to a load "Motor" that is a three-phase AC motor for example.

The inverter device 1 includes an input transformer Tr configured to receive input from a commercial AC power supply (for example, a 6.6 kV system). The input transformer Tr steps down a three-phase AC voltage, and inputs the stepped-down three-phase AC voltage to each inverter cell 2 (U1 to U6, V1 to V6, W1 to W6).

Figure 3:
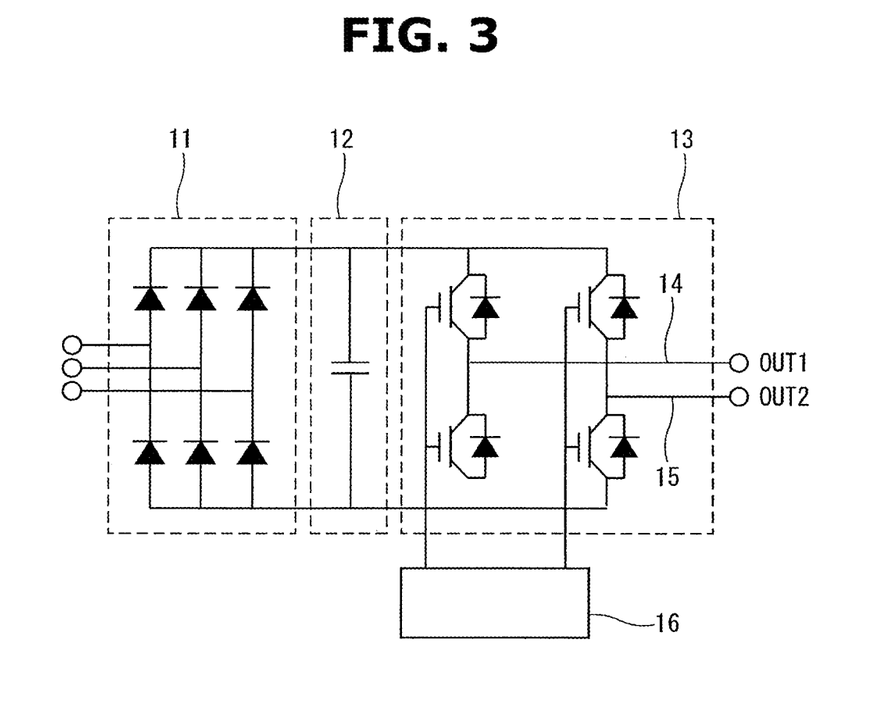
FIG. 3 is a circuit diagram showing an example of circuit configuration of a single-phase output inverter cell.

Each inverter cell 2 (U1 to U6, V1 to V6, W1 to W6) is configured as a unit in the same manner basically. FIG. 3 shows an example of circuit configuration of each inverter cell 2. The inverter cell 2 includes: a rectification section 11 composed of six diodes, and configured to perform rectify three-phase AC power into a DC voltage; a capacitor forming a DC link 12; and an inverter section 13 configured to perform reverse conversion from the DC voltage to a single-phase AC output. The inverter unit 13 includes two modules, each of which includes a pair of switching elements such as IGBTs, which serve as upper and lower arms, and are connected in series along with freewheeling diodes, wherein cell output lines 14, 15 are drawn out from an intermediate connecting point of a corresponding one of the switching elements. These cell output lines 14 and 15 are connected to cell output terminals OUT1 and OUT2 of the inverter cell 2, respectively. The four switching elements in total are controlled by control signals from a cell controller 16 provided for each inverter cell 2. The cell controller 16 of each inverter cell 2 is connected to a main controller 17 (see FIG. 1) via a signal line, wherein the main controller 17 is configured to control the entire inverter device 1, and perform integral control of the switching elements of all of the inverter cells 2.

In the example of configuration shown in FIG. 3, the rectification section 11 is composed of diodes. However, the rectification section 11 may be composed of a self-extinguishing-type switching element such as an IGBT instead of the diodes.

As described above, the U-phase section is composed of six inverter cells 2 (U1 to U6) connected in series. Specifically, a first-stage inverter cell U1 closest to the neutral point N includes a first cell output terminal OUT1 connected to the neutral point N via a line 3, and a second cell output terminal OUT2 connected to a cell output terminal OUT1 of a second-stage inverter cell U2 adjacent to the first-stage inverter cell U1. The second-stage inverter cell U2 includes a cell output terminal OUT2 connected to a cell output terminal OUT1 of a next-stage inverter cell U3. Similarly, inverter cells U4, U5, and U6 are connected in series. The output terminal OUT2 of the final-stage inverter cell U6 is connected to the output terminal Uout of the inverter device 1 via the output line 4. Similarly, the six inverter cells 2 (V1 to V6) forming the V-phase section and the six inverter cells 2 (W1 to W6) forming the W-phase section are connected in series. By the multiple series connection, each of the potentials of the output terminals OUT2 of the final-stage inverter cells U6, V6, and W6, namely, each of the potentials of the output terminals Uout, Vout, and Wout of the inverter device 1, is equal to a sum of the potential of the neutral point N and the output voltages of the inverter cells 2. For example, when the output voltage of each inverter cell 2 is 640 V, the difference in potential between the neutral point N and the output terminal OUT2 is 6×635 V=3810 V, and the inter-phase potential difference is 3810 V×√3≈6.6 kV.

Figure 4:
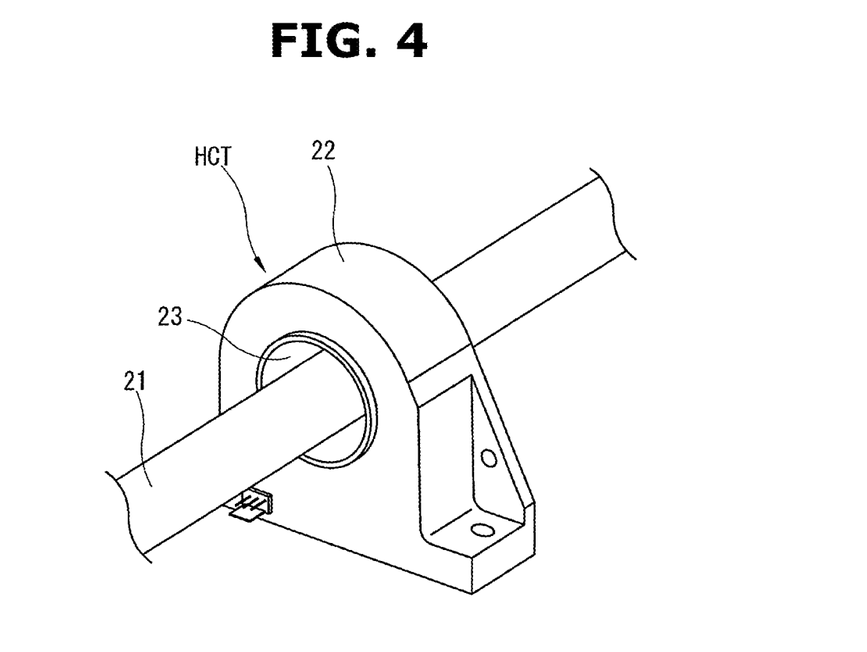
FIG. 4 is a perspective view showing an example of current sensor.

According to the present disclosure, the line 3 between the neutral point N and the neutral-point-side one of the six inverter cells 2 of each phase section closest to the neutral point N, wherein the neutral-point-side inverter cell 2 is the first-stage inverter cell U1, V1, W1, is provided with a current sensor HCT. For example, as shown in FIG. 4, the current sensor HCT is implemented by a through-type current sensor having an annular shape, in which a conductor (for example, a coated electric wire) 21 to be sensed is disposed to extend through a through hole 23 of a cabinet 22. These current sensors HCT are connected to the main controller 17 via respective signal lines. Each current sensor HCT senses a current flowing in the corresponding phase section, and acquires a current sensing value that is to be used by the main controller 17 for controlling an inverter output current, or performing a protection operation when the current flows excessively.

In the inverter device of patent document 1 described above, the output current is sensed at the high-voltage output line reaching the output terminal Uout, Vout, Wout of the inverter device. However, in configurations in which the multiple inverter cells 2 are connected in stages, the current flowing in the line 3 from the first-stage inverter cell U1, V1, W1 to the neutral point N is equal to the current flowing in the high-voltage output line from the final-stage inverter cell U6, V6, W6 to the output terminal Uout, Vout, Wout, so that the output current of each phase section can be sensed at the line 3 closest to the neutral point N. In the illustrated example, each of the U-phase, V-phase, and W-phase sections is provided with the current sensor HCT. However, assuming that there is no zero-phase current of the load Motor, the currents of two of the phases may be sensed and used to calculate the current of the remaining phase, because Iu+Iv+Iw=0 where Iu represents a U-phase current, Iv represents a V-phase current, and Iw represents a W-phase current. Therefore, only any two of the phase sections may be provided with the current sensor HCT.

The line 3 from the first-stage inverter cell U1, V1, W1 to the neutral point N has a low potential close to the ground potential. The line 3 of each phase section has the same potential. Therefore, the line 3 inserted through the through-hole 23 of the current sensor HCT may be an electric wire with a thin insulating coating and a small diameter and low withstand voltage specifications. Alternatively, a conductor with no insulating coating may be used as long as a clearance for insulation is ensured between the conductor and a board cabinet that is made of sheet metal and is at the ground potential. Therefore, the current sensor HCT for the line 3 as a target may be implemented by a small-sized and low withstand voltage type. This serves for inexpensiveness of the current sensor HCT, and reduces a space for accommodating the required current sensors HCT.

In the embodiment described above, as shown in FIG. 1, the neutral point N is grounded via a resistance R and a ground line 6. Accordingly, the potential of the line 3 is substantially equal to the ground potential. In the present disclosure, the resistance R may be replaced with another impedance component such as a reactor or a capacitor, because it is sufficient that the potential of the neutral point N is low and close to the ground potential. Alternatively, the neutral point N may be directly grounded without interposition of the impedance component.

FIG. 2 shows specific board configuration of the series multiplex inverter device 1 of the embodiment described above, which includes three boards arranged in a line, wherein the boards include a transformer board 31, an inverter board 32, and an output board 33. The transformer board 31 and the inverter board 32 are adjacent to each other, and the inverter board 32 and the output board 33 are adjacent to each other.

The transformer Tr of the series multiplex inverter device 1 whose circuit configuration is shown in FIG. 1 is accommodated in a cabinet of the transformer board 31. The transformer board 31 is connected at its one side to an AC power supply line 34 leading to a 6.6 kV commercial AC power supply or the like. The unitized eighteen inverter cells 2 (U1 to U6, V1 to V6, W1 to W6) in total are accommodated in a cabinet of the inverter board 32. For example, the six inverter cells 2 of each phase are vertically stacked and accommodated in the form of "3×6". The output board 33 includes a cabinet accommodating an output system of the inverter device 1, and includes a three-phase output terminal 35 connected to a load. The main controller 17 (control board) for controlling the entire inverter device 1 is accommodated in the cabinet of the output board 33. The main controller 17 is disposed closer to a side of the cabinet opposite to a side of the cabinet where the three-phase output terminal 35 is located, so as to ensure a large air clearance between the main controller 17 and the output line 4 shown in FIG. 1.

Each line 3 from the first-stage inverter cell U1, V1, W1 to the neutral point N shown in FIG. 1 includes a part diverted from the inverter board 32 into the cabinet of the output board 33. The three current sensors HCT corresponding to these lines 3 respectively are arranged in the cabinet of the output board 33. The current sensor HCT and the main controller 17 are arranged close to each other, so that the signal line therebetween is short.

In the configuration of the embodiment described above, the feature that each current sensor HCT has a small size and low withstand voltage specifications as described above, serves to reduce the space for accommodating the plurality (three in the embodiment) of required current sensors HCT, and thereby reduce the size of the series multiplex inverter device 1, and also reduce the cost of the current sensor HCT. In addition, the feature that each line 3 provided with the current sensor HCT is at a ground potential or a low potential close to the ground potential, and generally has a small potential difference from the cabinet made of sheet metal close to the ground potential, serves to enhance the flexibility of layout of the lines 3 in the cabinet and the flexibility of where the current sensors HCT are mounted.

Furthermore, the feature that the main controller 17 and the current sensors HCT are arranged close to each other in the cabinet of the output board 33, serves to prevent thermal effects caused by heating of the inverter cells 2 in the inverter board 32, and allow the length of each signal line between the main controller 17 and the current sensor HCT to be shortened to reduce superposition of noise generated by the inverter cells 2 and others in the signal line. This serves to allow the main controller 17 and the high-voltage output lines 4 to be arranged apart from each other in the cabinet of the output board 33, and thereby suppress the main controller 17 from receiving spatial noise generated from the high-voltage output lines 4.

Furthermore, the feature that the main controller 17 is at a low potential close to the ground potential, and each line 3 provided with the current sensor HCT is also at a low potential, serves to set relatively small the potential difference therebetween. For example, as compared with such a configuration as disclosed in patent document 1 in which the current sensors are arranged at the output lines 4, the potential difference between the main controller 17 and the line 3 provided with the current sensor HCT is very small. This serves to suppress malfunctioning from occurring due to noise caused by such a potential difference.

Figure 5:
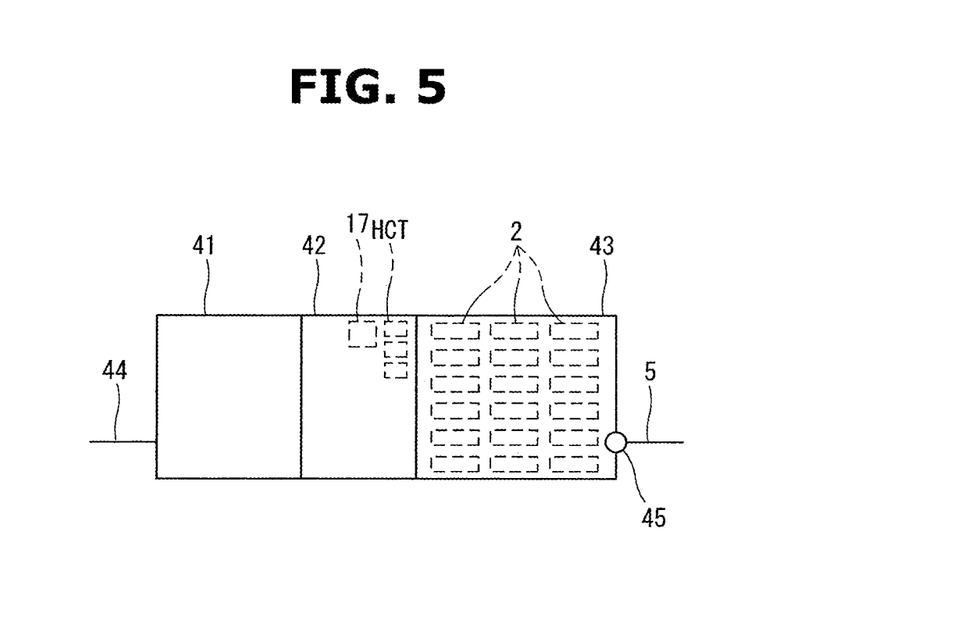
FIG. 5 is an explanatory diagram showing a second embodiment of board configuration of the inverter device.

FIG. 5 shows board configuration of an inverter device 1 according to a second embodiment. In the second embodiment, the inverter device 1 is composed of three boards arranged in a line, wherein the boards include a transformer board 41, a current sensor board 42, and an inverter board 43. The transformer board 41 and the current sensor board 42 are adjacent to each other, and the current sensor board 42 and the inverter board 43 are adjacent to each other.

The transformer Tr of the series multiplex inverter 3o device 1 whose circuit configuration is shown in FIG. 1 is accommodated in a cabinet of the transformer board 41. The transformer board 41 is connected at its one side to an AC power supply line 44 leading to a 6.6 kV commercial AC power supply or the like. The unitized eighteen inverter cells 2 (U1 to U6, V1 to V6, W1 to W6) in total are accommodated in a cabinet of the inverter board 43. For example, the six inverter cells 2 of each phase are vertically stacked and accommodated in the form of "3×6". The inverter board 43 includes a three-phase output terminal 45 at a side opposite to the current sensor board 42, wherein the three-phase output terminal 45 is connected to a load.

In this embodiment, the current sensors HCT provided for the U-phase, V-phase, and W-phase sections respectively are accommodated in a cabinet of the current sensor board 42. The main controller 17 is also accommodated in the cabinet of the current sensor board 42. The main controller 17 and each current sensor HCT are arranged close to each other so as to reduce the length of the signal line therebetween as short as possible.

Figure 6:
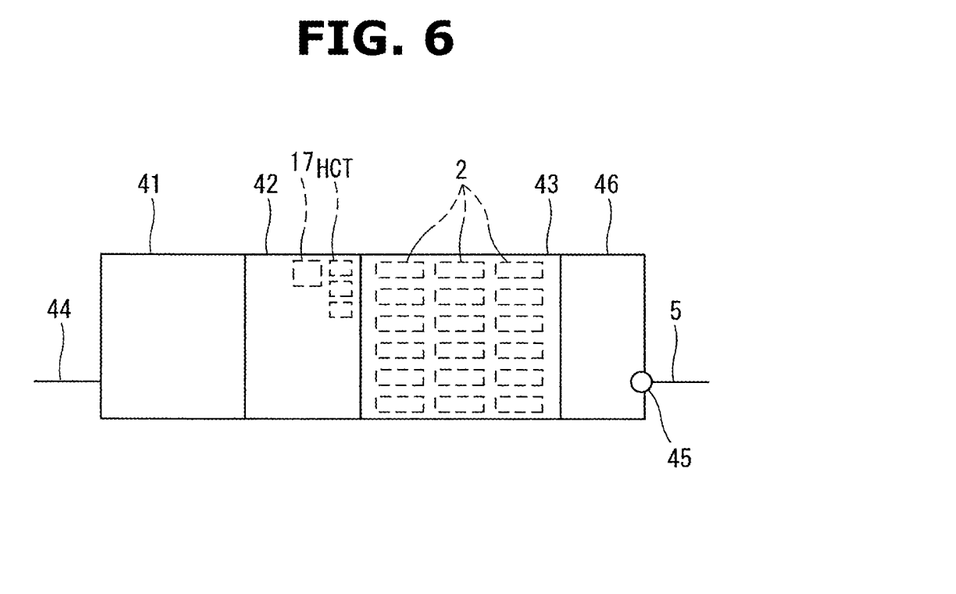
FIG. 6 is an explanatory diagram showing a third embodiment of board configuration of the inverter device.

Furthermore, as shown in FIG. 6, a third embodiment may be configured such that an output board 46 is provided adjacent to the inverter board 43, and an output system is accommodated in a cabinet of the output board 46 separately from the inverter board 43. In the third embodiment, a three-phase output terminal 45 is provided at the output board 46.

In the second and third embodiments configured as described above, the feature that each current sensor HCT has a small size and low withstand voltage specifications as in the first embodiment described above, serves to reduce the space for accommodating the plurality (three in the embodiment) of required current sensors HCT, and thereby reduce the size of the series multiplex inverter device 1, and also reduce the cost of the current sensor HCT. In addition, the feature that each line 3 is at a low potential, serves to enhance the flexibility of layout of the lines 3 in the cabinet and the flexibility of where the current sensors HCT are mounted.

Furthermore, the feature that the main controller 17 and the current sensors HCT are arranged close to each other in the cabinet of the current sensor board 42, serves to prevent thermal effects caused by heating of the inverter cells 2 in the inverter board 43, and allow the length of each signal line between the main controller 17 and the current sensor HCT to be shortened to reduce superposition of noise generated by the inverter cells 2 and others in the signal line. The further feature that the high-voltage output lines 4 and the main controller 17 are accommodated in different cabinets and arranged apart from each other, wherein the high-voltage output lines 4 is accommodated in the inverter board 43 and the output board 46, and the main controller 17 is accommodated in the cabinet of the current sensor board 42, serves to suppress the main controller 17 from receiving spatial noise generated from the high-voltage output lines 4.

Furthermore, the feature that the main controller 17 is at a low potential close to the ground potential, and each line 3 provided with the current sensor HCT is also at a low potential, serves to set relatively small the potential difference therebetween, and thereby suppress malfunctioning from occurring due to noise caused by a potential difference.

The board configurations according to the second and third embodiments may be modified such that the main controller 17 is accommodated in the transformer board 41. This modification causes a slight increase in the length of the signal line between the main controller 17 and the current sensor HCT, but serves to ensure a larger air clearance between the main controller 17 and the high-voltage output line 4.

Figure 7:
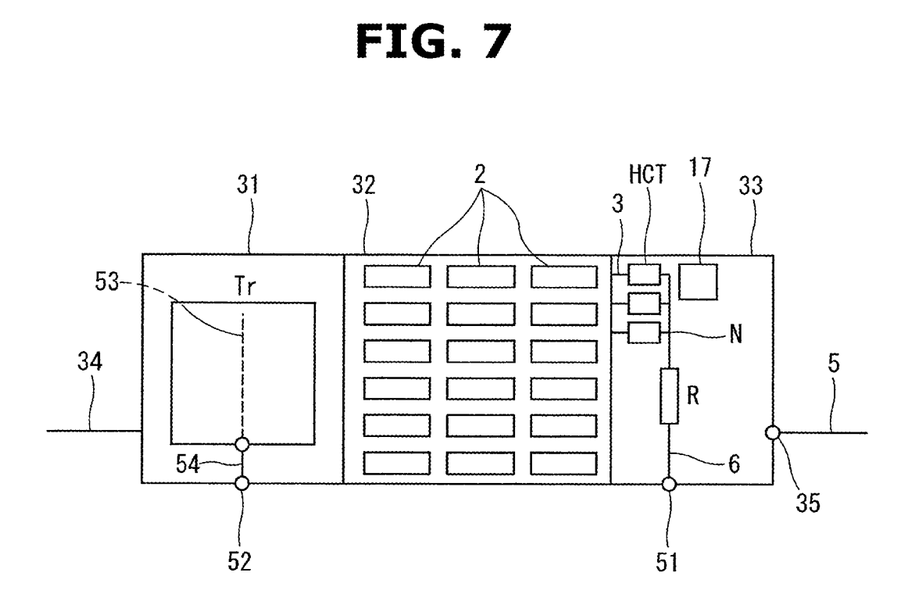
FIG. 7 is an explanatory diagram showing further details of the board configuration according to the first embodiment.

FIG. 7 shows further details of the board configuration of the first embodiment shown in FIG. 2. As shown in FIG. 7, in the cabinet of the output board 33, each line 3 passing through the current sensor HCT of the corresponding phase section is connected to each other at the neutral point N. The neutral point N is connected via a ground line 6 to a first ground terminal 51 provided to the cabinet of the output board 33. In particular, in this embodiment, the neutral point N is grounded via a resistance R, wherein the grounding resistance R is accommodated in the cabinet of the output board 33 together with the current sensors HCT and the ground line 6. When the resistance R is replaced with another impedance component such as a reactor and a capacitor interposed between the neutral point N and the ground point as described above, components constituting the impedance component are provided in the cabinet of the output board 33. Alternatively, the neutral point N may be connected to the first ground terminal 51 directly, namely, without interposition of an impedance component.

Furthermore, as described above, the transformer Tr is accommodated in the cabinet of the transformer board 31. The cabinet of the transformer board 31 is provided with a second ground terminal 52, and an interference prevention plate 53 for the transformer Tr is connected to the second ground terminal 52 via a line 54. In general, a high-voltage or large-capacity transformer is provided with an interference prevention plate between a primary winding and a secondary winding in order to suppress damages caused by occurrence of dielectric breakdown between the primary winding and the secondary winding, wherein the interference prevention plate is set at a ground potential. In the illustrated example, the interference prevention plate 53 is grounded via the second ground terminal 52 provided to the cabinet of the transformer board 31.

The first ground terminal 51 and the second ground terminal 52 are connected via respective lines not shown to a ground electrode provided in a room where the inverter device 1 is installed.

The feature that the resistance R provided between the neutral point N and the ground point is accommodated in the cabinet of the board in which the current sensors HCT of the respective phases are accommodated, namely, in the cabinet of the output board 33, serves to allow the resistance R to be arranged close to the current sensors HCT, and thereby shorten the length of each line between the resistance R and the current sensor HCT. The shortening of the line length serves to enhance workability of wiring operation during manufacturing the inverter device 1, and reduce the cost of wiring, and improve noise resistance during energization.

Furthermore, the feature that the first ground terminal 51 for grounding the neutral point N is provided at the output board 33 in addition to the second ground terminal 52 of the transformer board 31, serves to connect the neutral point N to the first ground terminal 51 by the grounding line 6 in the cabinet of the output board 33, and thereby reduce the line length of the ground line 6.

If the neutral point N is grounded to the second ground terminal 52 of the transformer board 31 without provision of the first ground terminal 51, the ground line 6 from the neutral point N to the second ground terminal 52 extends from the output board 33 to the transformer board 31 through the inverter board 32. This configuration causes an increase in the line length of the ground line 6, and also requires through holes of the cabinets for the ground line 6 to pass through, and thereby increase the number of operations for manufacturing the device. In the illustrated example, such a problem is avoided by providing the ground terminals 51 and 52 at the output board 33 and the transformer board 31 respectively.

Figure 8:
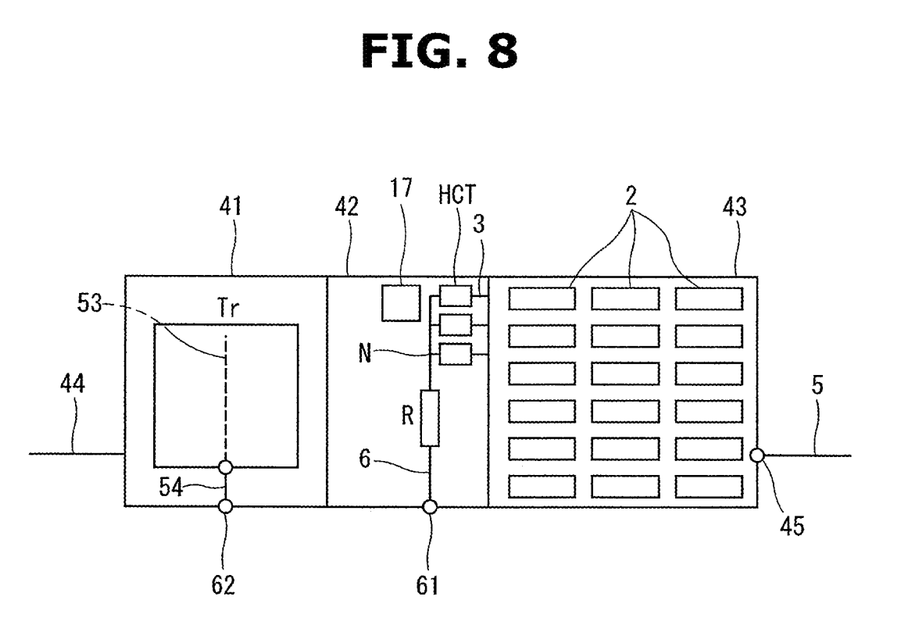
FIG. 8 is an explanatory diagram showing further details of the board configuration according to the second embodiment.

FIG. 8 shows further details of the board configuration of the second embodiment shown in FIG. 5. In this example, the inverter device 1 is composed of three boards, namely, the transformer board 41, the current sensor board 42, and the inverter board 43, wherein the lines 3 passing through the current sensors HCT of the respective phases are connected to each other at the neutral point N in the cabinet of the current sensor board 42 in which the current sensors HCT are accommodated. The neutral point N is connected via a ground line 6 to a first ground terminal 61 provided at the cabinet of the current sensor board 42. In the illustrated example, the neutral point N is grounded via a resistance R, wherein this grounding resistance R is accommodated in the cabinet of the current sensor board 42 together with the current sensors HCT and the ground line 6. When the resistance R is replaced with another impedance component such as a reactor and a capacitor interposed between the neutral point N and the ground point as described above, components constituting the impedance component are provided in the cabinet of the current sensor board 42. Alternatively, the neutral point N may be connected to the first ground terminal 61 directly, namely, without interposition of an impedance component.

Furthermore, the transformer Tr is provided with an interference prevention plate 53, and is accommodated in the cabinet of the transformer board 41, and the interference prevention plate 53 is connected via a line 54 to a second ground terminal 62 provided at the cabinet of the transformer board 41.

The first ground terminal 61 and the second ground terminal 62 are connected via respective lines not shown to a ground electrode provided in a room where the inverter device 1 is installed.

Figure 9:
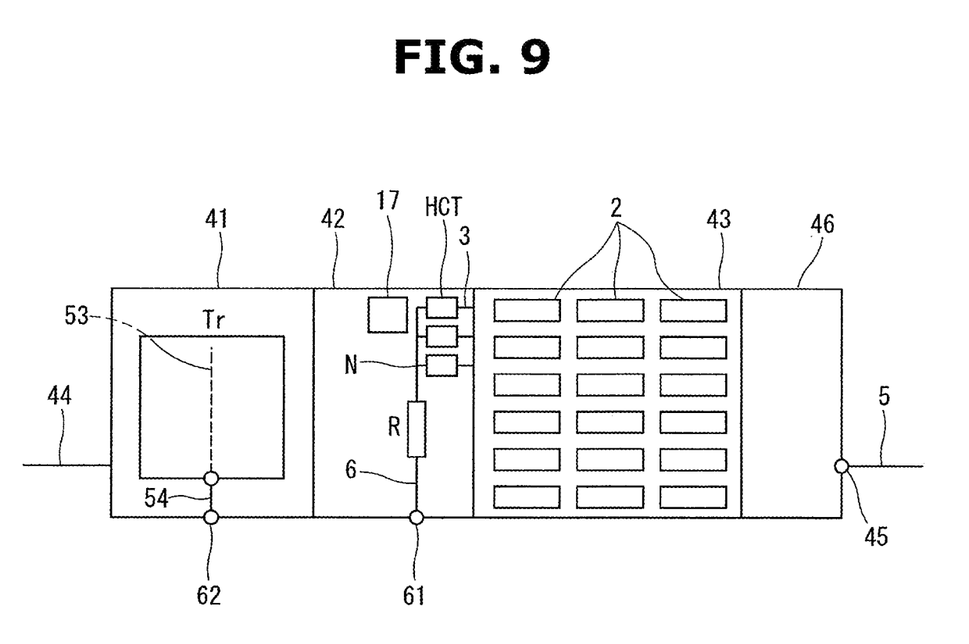
FIG. 9 is an explanatory diagram showing further details of the board configuration according to the third embodiment.

FIG. 9 shows further details of the board configuration of the third embodiment shown in FIG. 6. In this example, the inverter device 1 includes four boards, namely, the transformer board 41, the current sensor board 42, the inverter board 43, and the output board 46, wherein the output system is accommodated in the cabinet of the output board 46. The current sensor HCT of each phase is accommodated in the cabinet of the current sensor board 42, and the grounding resistance R is accommodated in the cabinet of the current sensor board 42 as in the embodiment shown in FIG. 8. Furthermore, the first ground terminal 61 is provided in the cabinet of the current sensor board 42 separately from the second ground terminal 62 of the transformer board 41.

In the embodiments shown in FIGS. 8 and 9, the grounding resistance R is accommodated in the current sensor board 42 adjacent to the transformer board 41, and the first grounding terminal 61 for grounding the resistance R is provided in the current sensing board 42 separately from the second ground terminal 62 of the transformer board 41. This serves to eliminate the necessity of formation of a through hole in each cabinet for the ground line 6 to pass through, and shorten the line length of the ground line 6.

In the embodiments described above, the current sensor HCT is implemented by a through-type current sensor. However, the present disclosure may employ a type of current sensor other than the through-type current sensor. Also in this case, the current sensor has low withstand voltage specifications, and is smaller and less expensive than those having high withstand voltage specifications.

Furthermore, in the embodiments described above, the six single-phase output inverter cells 2 are connected in series, but the present disclosure may be implemented by an arbitrary number of single-phase output inverter cells 2 connected in series.

The invention claimed is:

1. An inverter device comprising:
   phase sections including a U-phase section, a V-phase section, and a W-phase section, each of which includes multiple single-phase output inverter cells connected in series, and wherein each of the single-phase output inverter cells is configured to receive input of alternating current power via a transformer;
   a neutral point to which an end of the series connection of each of the phase sections is connected;
   at least two current sensors, each of which is disposed at a line between the neutral point and a neutral-point-side single-phase output inverter cell of the single-phase output inverter cells of a corresponding one of the phase sections closest to the neutral point;
   a transformer board including a cabinet containing the transformer;
   an inverter board including a cabinet containing the single-phase output inverter cells, wherein the inverter board is disposed adjacent to the transformer board; and
   an output board including a cabinet containing a controller, wherein the output board includes a three-phase output terminal structured to be connected to a load, and is disposed adjacent to the inverter board, wherein the controller is configured to control the single-phase output inverter cells;
   wherein each of the lines from the neutral-point-side single-phase output inverter cell to the neutral point includes a part diverted from the inverter board into the cabinet of the output board; and
   wherein each of the current sensors disposed at the corresponding lines is arranged in the cabinet of the output board.

2. The inverter device as claimed in claim 1, wherein:
   the neutral point is grounded via an impedance component; and
   the impedance component is implemented by a component contained in the cabinet of the output board.

3. The inverter device as claimed in claim 2, wherein each of the current sensors is a through-type current sensor.

4. The inverter device as claimed in claim 1, wherein:
   each of the transformer board and the output board includes a ground terminal; and
   the neutral point is connected to the ground terminal of the output board directly or via an impedance component.

5. The inverter device as claimed in claim 4, wherein each of the current sensors is a through-type current sensor.

6. The inverter device as claimed in claim 1, wherein each of the current sensors is a through-type current sensor.

7. An inverter device comprising:
   phase sections including a U-phase section, a V-phase section, and a W-phase section, each of which includes multiple single-phase output inverter cells connected in series, and wherein each of the single-phase output inverter cells is configured to receive input of alternating current power via a transformer;
   a neutral point to which an end of the series connection of each of the phase sections is connected;
   at least two current sensors, each of which is disposed at a line between the neutral point and a neutral-point-side single-phase output inverter cell of the single-phase output inverter cells of a corresponding one of the phase sections closest to the neutral point;
   a transformer board including a cabinet containing the transformer;
   a current sensor board including a cabinet that contains a controller and each of the current sensors, wherein the current sensor board is disposed adjacent to the transformer board, and wherein the controller is configured to control the single-phase output inverter cells; and
   an inverter board including a cabinet containing the single-phase output inverter cells, wherein the inverter board is disposed adjacent to the current sensor board.

8. The inverter device as claimed in claim 7, wherein:
   the neutral point is grounded via an impedance component; and
   the impedance component is implemented by a component contained in the cabinet of the current sensor board.

9. The inverter device as claimed in claim 8, wherein each of the current sensors is a through-type current sensor.

10. The inverter device as claimed in claim 7, wherein:
    each of the transformer board and the current sensor board includes a ground terminal; and
    the neutral point is connected to the ground terminal of the current sensor board directly or via an impedance component.

11. The inverter device as claimed in claim 10, wherein each of the current sensors is a through-type current sensor.

12. The inverter device as claimed in claim 7, wherein each of the current sensors is a through-type current sensor.

* * * * *